United States Patent
Koide

(10) Patent No.: US 8,760,619 B2
(45) Date of Patent: Jun. 24, 2014

(54) EXPOSURE APPARATUS AND METHOD OF MANUFACTURING DEVICE

(75) Inventor: Hiroyuki Koide, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 781 days.

(21) Appl. No.: 12/962,903

(22) Filed: Dec. 8, 2010

(65) Prior Publication Data

US 2011/0134404 A1   Jun. 9, 2011

(30) Foreign Application Priority Data

Dec. 8, 2009 (JP) .................................. 2009-278943

(51) Int. Cl.
*G03B 27/68* (2006.01)
*G03B 27/32* (2006.01)

(52) U.S. Cl.
USPC ............................................. 355/52; 355/77

(58) Field of Classification Search
USPC ................................................. 355/53, 77, 52
See application file for complete search history.

(56) References Cited

U.S. PATENT DOCUMENTS

| | | | |
|---|---|---|---|
| 5,117,254 A * | 5/1992 | Kawashima et al. ............ | 355/43 |
| 7,193,685 B2 | 3/2007 | Miura | |
| 2005/0128453 A1* | 6/2005 | Miura ............................. | 355/55 |
| 2006/0279717 A1* | 12/2006 | Hirano ............................ | 355/53 |

FOREIGN PATENT DOCUMENTS

| | | |
|---|---|---|
| JP | 0314217 A | 1/1991 |
| JP | 1097988 A | 4/1998 |
| JP | 2005-175400 A | 6/2005 |

OTHER PUBLICATIONS

Japanese Office Action cited in Japanese counterpart application No. JP2009-278943, dated Oct. 4, 2013.

* cited by examiner

*Primary Examiner* — Peter B Kim
*Assistant Examiner* — Deoram Persaud
(74) *Attorney, Agent, or Firm* — Rossi, Kimms & McDowell, LLP

(57) ABSTRACT

An exposure apparatus includes an original stage including a first mark, a substrate stage including a second mark and a photoelectric conversion device configured to detect light having passed through the second mark, a projection optical system, a measurement device configured to measure a position of at least one stage of the substrate stage and the original stage, and a controller configured to detect a positional relationship between the first mark and the second mark based on a signal output from the photoelectric conversion device and a measurement result output from the measurement device, wherein the controller cyclically samples a measurement result output from the measurement device, corrects the measurement result based on a time interval between a light emission timing of the pulsed light source and a sampling timing of the measurement result.

9 Claims, 4 Drawing Sheets

EXPOSURE APPARATUS AND METHOD OF MANUFACTURING DEVICE

BACKGROUND OF THE INVENTION

1. Field of the Invention

The present invention relates to an exposure apparatus and a method of manufacturing a device using the same.

2. Description of the Related Art

An exposure apparatus is employed to manufacture micropatterned semiconductor devices such as a semiconductor memory and a logic circuit using photolithography. The exposure apparatus projects the pattern of an original onto a substrate by a projection optical system to expose the substrate. A pulsed emission laser (pulsed light source) such as a KrF, ArF, or $F_2$ excimer laser, for example, can be used as a light source for exposure. Also, a reticle stage and a wafer stage have their positions measured by position measurement devices such as laser interferometers, and are driven by stage driving mechanisms based on the position measurement results.

In substrate exposure, an original and a substrate must be precisely aligned with each other. To do this, it is necessary to detect the positional relationship between an original stage which holds the original and a substrate stage which holds the substrate. By additionally detecting the positional relationships between the original and the original stage and between the substrate and the substrate stage, the positional relationship between the original and the substrate can be detected. Based on this detection result, the original and the substrate can be aligned with each other.

A known scheme of detecting the positional relationship between an original stage and a substrate stage is as follows. First marks are arranged on the original stage, and second marks and a photoelectric conversion device which detects light having passed through the second marks are arranged on the substrate stage. The substrate stage is moved while causing light supplied from a light source to enter the photoelectric conversion device via the first marks, a projection optical system, and the second marks. When a signal output from the photoelectric conversion device has a maximum level, the substrate stage is at a position where the first marks and the second marks have an optimum positional relationship. Note that when a signal output from the photoelectric conversion device has a maximum level upon moving the substrate stage within a plane perpendicular to the optical axis of the projection optical system, the substrate stage is at a best alignment position. When a signal output from the photoelectric conversion device has a maximum level upon moving the substrate stage along the optical axis of the projection optical system, the substrate stage is at a best focus position.

SUMMARY OF THE INVENTION

The present invention provides a technique advantageous to reduce a detection error of the positional relationship between marks on an original stage and those on a substrate stage.

One of the aspects of the present invention provides an exposure apparatus comprising an original stage including a first mark, a substrate stage including a second mark and a photoelectric conversion device configured to detect light having passed through the second mark, a projection optical system configured to project a pattern of an original held by the original stage onto a substrate held by the substrate stage, a measurement device configured to measure a position of at least one stage of the substrate stage and the original stage, and a controller configured to detect a positional relationship between the first mark and the second mark based on a signal output from the photoelectric conversion device and a measurement result output from the measurement device upon moving the at least one stage of the substrate stage and the original stage while causing light supplied from a pulsed light source to enter the photoelectric conversion device via the first mark, the projection optical system, and the second mark, wherein the controller cyclically samples a measurement result output from the measurement device, corrects the measurement result based on a time interval between a light emission timing of the pulsed light source and a sampling timing of the measurement result to determine a position of the at least one stage of the substrate stage and the original stage at the light emission timing, and detects the positional relationship between the first mark and the second mark based on the determined position.

Further features of the present invention will become apparent from the following description of exemplary embodiments with reference to the attached drawings.

DESCRIPTION OF THE EMBODIMENTS

When a position control system for a substrate stage serves as a digital control system, it samples the position information of the substrate stage at a predetermined cycle corresponding to its sampling clock. A pulsed light source used as a light source for exposure emits pulsed light asynchronously with the position control system for the substrate stage. The light emission frequency of the pulsed light source is normally different from the frequency of the sampling clock in the position control system for the substrate stage. Hence, the actual position of the substrate stage during pulsed emission (that is, the position of the substrate stage the moment a photoelectric conversion device receives light having passed through second marks) does not coincide with the position of the substrate stage, which is sampled by the position control system. As a result, the alignment accuracy or the focus accuracy may deteriorate.

Figure 4:
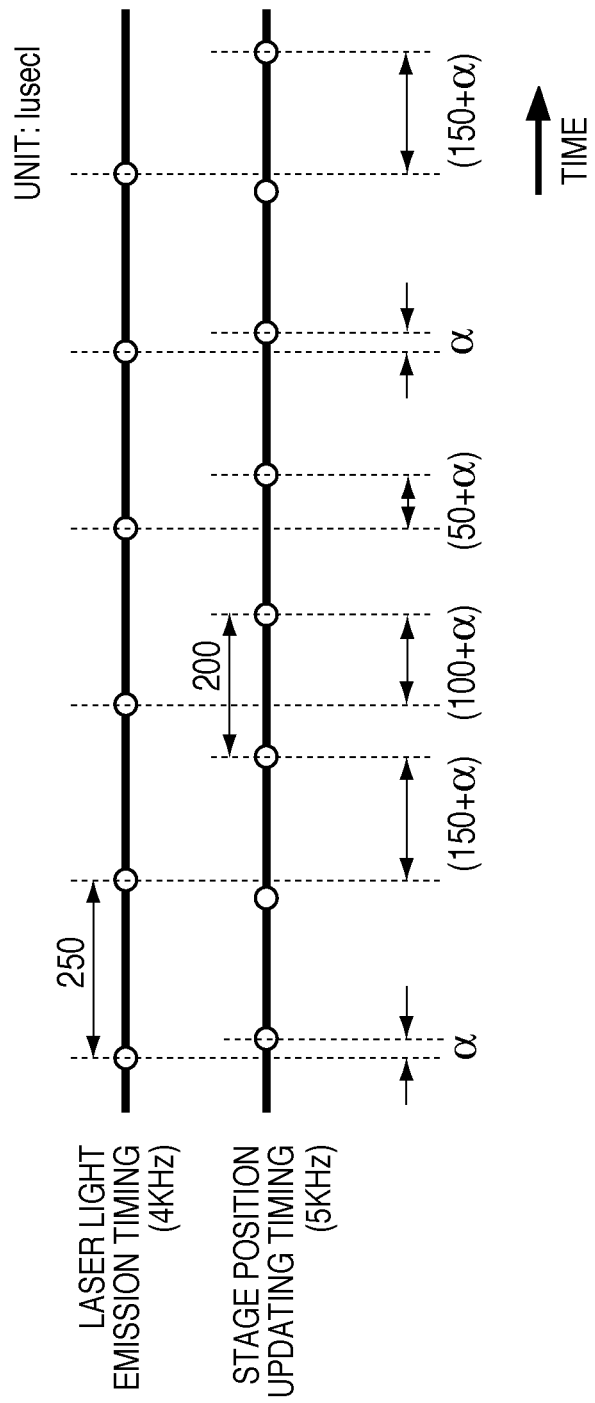
FIG. 4 is a chart illustrating the laser light emission timing and the stage position updating timing.

FIG. 4 illustrates the light emission timing of a laser light source and the timing at which the measurement result of the stage position is updated, when the frequency of this updating is 5 kHz and the light emission frequency of the laser light source is 4 kHz. The light emission timing and the updating timing have lags of, for example, $\alpha$ [µs], $(150+\alpha)$ [µs], $(100+\alpha)$ [µs], $(50+\alpha)$ [µs], and $\alpha$ [µs] for $0 \leq \alpha < 50$ [µs]. Because the light emission timing and the updating timing are asynchronous with each other, the value of $\alpha$ randomly varies for each alignment measurement operation.

Figure 5:
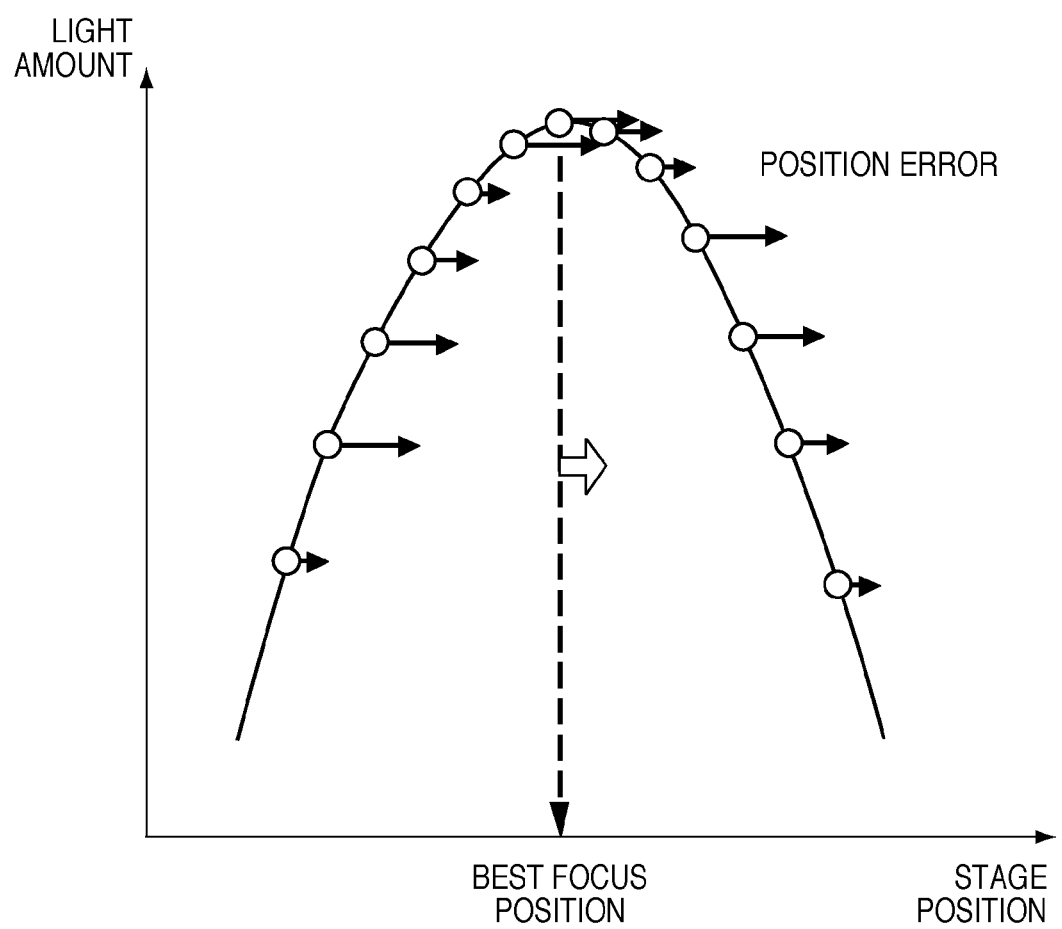
FIG. 5 is a graph for explaining the detection principle of a best focus position.

FIG. 5 is a graph showing a plot of the light amount detected by the photoelectric conversion device at the light emission timing and updating timing shown in FIG. 4 on the ordinate, and the stage position measured by a measurement device at these timings on the abscissa. Because the light emission timing and the updating timing do not coincide with each other, a best focus position where the light amount curve has a maximum value has an error, as can be seen from FIG. 5.

The following embodiments of the present invention have been made in consideration of the above-mentioned problem recognized by the inventor of the present invention, and are advantageous to reduce a detection error of the positional relationship between marks on an original stage and those on a substrate stage.

First Embodiment

Figure 2:
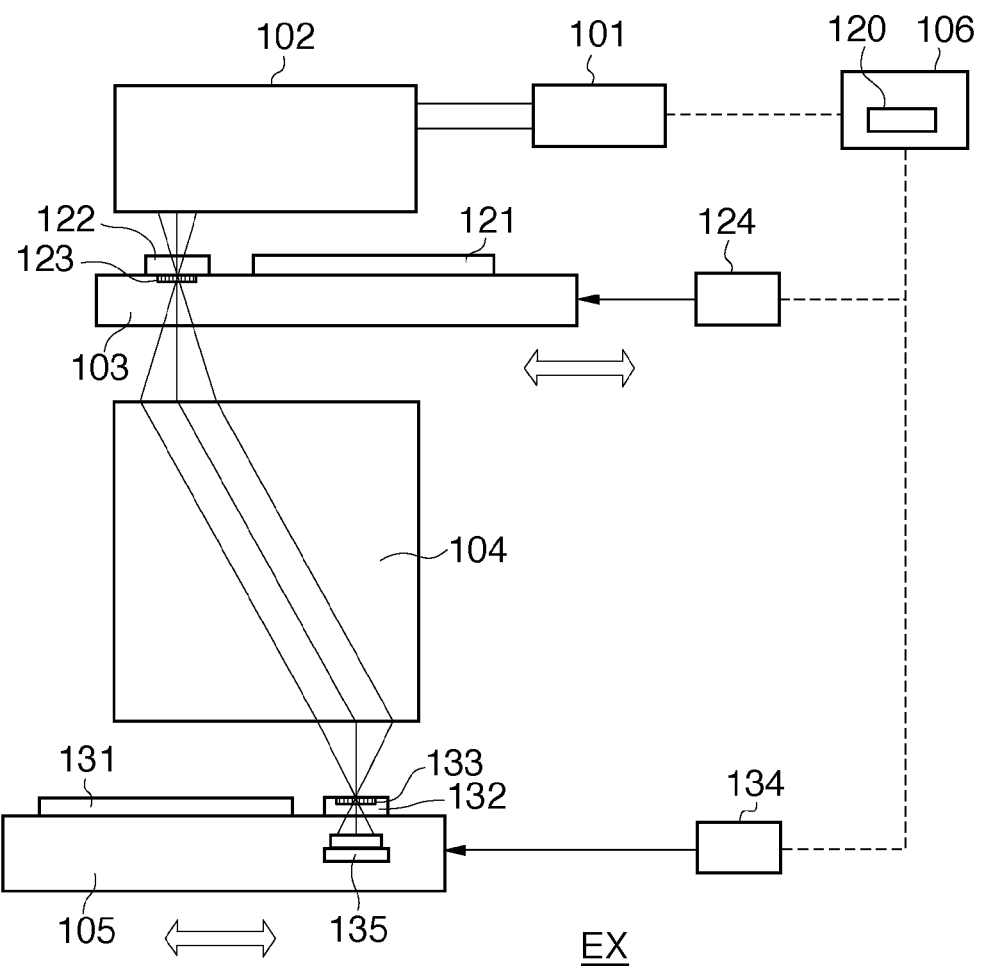
FIG. 2 is a view showing the schematic arrangement of an exposure apparatus according to each of the first and second embodiments.

The arrangement of an exposure apparatus EX according to the first embodiment of the present invention will be described with reference to FIG. 2. The exposure apparatus EX can be, for example, a scanning exposure apparatus which transfers the pattern of an original onto a substrate by the step & scan scheme. The exposure apparatus EX can include a pulsed light source 101, illumination optical system 102, original stage 103, projection optical system 104, substrate stage 105, measurement devices 124 and 134, and controller 106.

The pulsed light source 101 includes, for example, a pulsed laser light source. Examples of the pulsed laser light source include a KrF excimer laser which emits light with a wavelength of about 248 nm, an ArF excimer laser which emits light with a wavelength of about 193 nm, and an $F_2$ laser which emits light with a wavelength of about 157 nm. The illumination optical system 102 illuminates an original (reticle) 121 or a first mark 123 by means of light supplied from the pulsed light source 101, and includes, for example, a lens, mirror, and stop.

Figure 3:
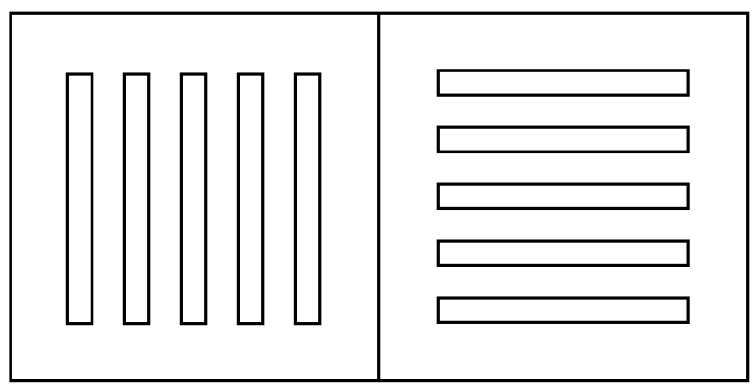
FIG. 3 is a view illustrating marks provided on an original stage and substrate stage.

The original stage (reticle stage) 103 includes an original chuck, and holds the original 121 using the original chuck. The original stage 103 is driven, scanned, or positioned by an original driving mechanism (not shown). The original driving mechanism includes, for example, a linear motor. The original stage 103 includes an original-side fiducial plate 122. The original-side fiducial plate 122 has its pattern surface flush with that of the original 121. A plurality of first marks (original-side marks) 123 made of a metal such as Cr or Al are arranged on the pattern surface of the original-side fiducial plate 122. The first mark 123 can include, for example, a line-and-space pattern having linear openings, as illustrated in FIG. 3. The position of the original stage 103 is measured by the measurement device 124. The measurement device 124 includes, for example, a laser interferometer.

The projection optical system 104 projects the pattern of the original 121 held by the original stage 103 onto a substrate 131 held by the substrate stage 105. Thus, the substrate 131 is exposed, and the pattern of the original 121 is transferred onto the substrate 131.

The substrate stage 105 includes a substrate chuck, and holds the substrate (for example, a wafer) 131 by the substrate chuck. The substrate stage 105 is driven, scanned, or positioned by a substrate driving mechanism (not shown). The substrate driving mechanism can drive the substrate stage 105 in six axial directions: the Z-axis direction (optical axis direction) of the projection optical system 104, the X- and Y-axis directions perpendicular to the Z-axis direction, and rotation directions about the X-, Y-, and Z-axes. The substrate stage 105 includes a substrate-side fiducial plate 132. The substrate-side fiducial plate 132 has its pattern surface flush with the upper surface of the substrate 131. A plurality of second marks (substrate-side marks) 133 made of a metal such as Cr or Al are arranged on the pattern surface of the substrate-side fiducial plate 132. The second mark 133 includes, for example, a pattern obtained by reducing the first mark 123 at the projection magnification of the projection optical system 104. The position of the substrate stage 105 is measured by the measurement device 134. The measurement device 134 includes, for example, a laser interferometer.

The controller 106 serves as a digital signal processor, and cyclically samples the position measurement result of the original stage 103, which is output from the measurement device 124, and that of the substrate stage 105, which is output from the measurement device 134. The controller 106 moves the substrate stage 105 while causing light supplied from the pulsed light source 101 to enter a photoelectric conversion device 135 via the first marks 123, projection optical system 104, and second marks 133. The controller 106 detects the positional relationship between the first marks 123 and the second marks 133 based on a signal (a signal indicating the light amount) output from the photoelectric conversion device 135 and a position measurement result output from the measurement device 134 at that time. Note that in moving the substrate stage 105, the original stage 103 is positioned such that the first marks 123 coincide with the object plane of the projection optical system 104.

When a signal output from the photoelectric conversion device 135 has a maximum value upon moving the substrate stage 105 within the X-Y plane, the positional relationship between the first marks 123 and the second marks 133 allows best alignment. On the other hand, when a signal output from the photoelectric conversion device 135 has a maximum value upon moving the substrate stage 105 in the Z-axis direction, the positional relationship between the first marks 123 and the second marks 133 allows best focusing.

The controller 106 detects not only the positional relationship between the first marks 123 and the second marks 133 but also those between the original 121 and the original stage 103 and between the substrate 131 and the substrate stage 105 using a known method. The controller 106 determines the positional relationship between the original 121 and the substrate 131 based on the above-mentioned pieces of information, and aligns the original 121 and the substrate 131 with each other based on the determined positional relationship.

Figure 1:
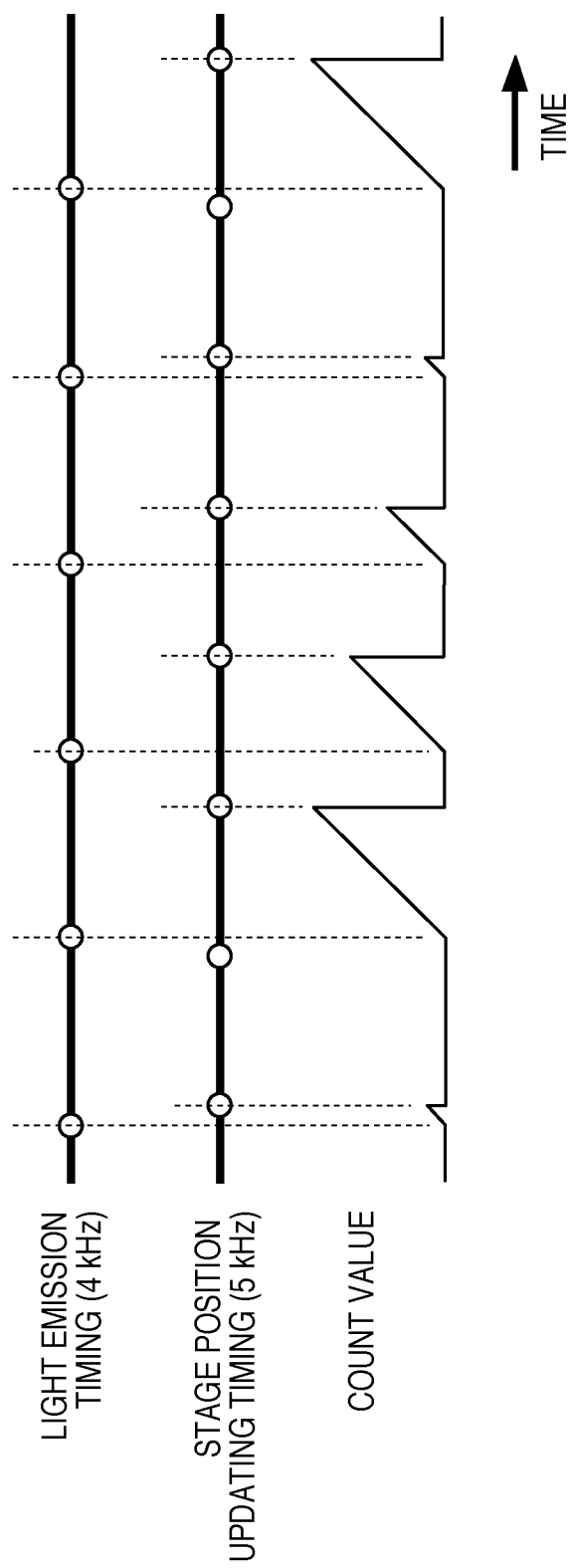
FIG. 1 is a chart illustrating the laser light emission timing, the stage position updating timing, and the count value in an exposure apparatus according to the first embodiment.

Detection of the positional relationship between the first marks 123 and the second marks 133 will be described in detail below. FIG. 1 illustrates the light emission timing of the laser light source and the timing at which the position measurement result of the substrate stage 105 is updated, when the frequency of this updating is 5 kHz and the light emission frequency of the laser light source is 4 kHz. Note that the measurement result of the stage position is updated at the frequency at which the controller 106 updates the measurement result of the substrate stage 105 obtained by the measurement device 134, that is, the frequency at which the controller 106 samples the measurement result of the substrate stage 105 obtained by the measurement device 134. The light emission frequency of the laser light source is that of the pulsed laser light source as the pulsed light source 101.

The controller 106 includes a counter 120, which starts counting in accordance with the light emission timing of the pulsed light source 101 and ends the counting in accordance with the timing (sampling timing) at which the controller 106 samples the position measurement result output from the measurement device 134. FIG. 1 illustrates the count value obtained by the counter 120. Based on the count value obtained by the counter 120, the controller 106 corrects the position measurement result (the position of the substrate stage 105) output from the measurement device 134. Correction of the position measurement result (the position of the substrate stage 105) by the controller 106 will be exemplified below.

The counter 120 starts counting in accordance with the light emission timing of the pulsed light source 101 (for example, the timing at which the controller 106 issues a light emission command to the pulsed light source 101) and ends the counting in accordance with the sampling timing. The count value obtained by the counter 120 corresponds to a time interval delay[i] between the light emission timing of the pulsed light source 101 and the timing at which the controller 106 samples the position measurement result. The controller 106 multiplies the count value by a coefficient and can thereby calculate the time interval delay[i] between the light emission timing of the pulsed light source 101 and the timing at which the controller 106 samples the position measurement result.

Let position[i] be the position measurement result obtained by the measurement device 134, that is, the position of the substrate stage 105, and vel[i] be the velocity of the substrate stage 105, where i is the number of arithmetic operation by the controller 106, and m is the number of pulsed light emitted by the pulsed light source 101. Then, the controller 106 corrects the position measurement result position[i] in accordance with:

$$p[m]=\text{position}[i]-vel[i]\times\text{delay}[i] \quad (1)$$

(that is, based on the time interval delay[i]) to determine a position (actual position) p[m] of the substrate stage 105 at the light emission timing of the pulsed light source 101. The controller 106 also detects the positional relationship between the first marks 123 and the second marks 133 based on the actual position of the substrate stage 105. The positional relationship between the first marks 123 and the second marks 133 is detected based on the actual position (the position obtained by correcting the position measurement result) of the substrate stage 105 when the signal (light amount) output from the photoelectric conversion device 135 has a maximum value.

The controller 106 detects the positional relationship between the first marks 123 and the second marks 133 within the X-Y plane based on a signal output from the photoelectric conversion device 135 and a position measurement result output from the measurement device 134 upon moving the substrate stage 105 within the X-Y plane. The controller 106 also detects the positional relationship between the first marks 123 and the second marks 133 in the Z-axis direction based on a signal output from the photoelectric conversion device 135 and a position measurement result output from the measurement device 134 upon moving the substrate stage 105 in the Z-axis direction.

In the foregoing description, the counter 120 starts counting in accordance with the light emission timing of the pulsed light source 101 and ends the counting in accordance with the sampling timing. Instead of this, the counter 120 may start counting in accordance with the sampling timing and end the counting in accordance with the light emission timing of the pulsed light source 101. In the latter case, the actual position of the substrate stage 105 can be determined in accordance with:

$$p[m]=\text{position}[i]+vel[i]\times\text{delay}[i] \quad (2)$$

Although a case in which the stage position updating frequency is 5 kHz and the laser light emission frequency is 4 kHz has been exemplified above, the present invention is also applicable to other frequencies, and the frequencies may change with time.

In the foregoing description, the second marks 133 (substrate stage 105) move while the first marks 123 are placed on the object plane of the projection optical system 104. Instead of this, the first marks 123 (original stage 103) may move while the second marks 133 (substrate stage 105) are placed on the image plane of the projection optical system 104. In the latter case, the measurement result which is output from the measurement device 124 and sampled by the controller 106 is corrected in accordance with the above-mentioned principle, and the actual position of the original stage 103 is detected.

Second Embodiment

An exposure apparatus EX according to the second embodiment will be described with reference to FIG. 2. In the exposure apparatus EX according to the second embodiment, a controller 106 cyclically samples the position measurement result (the position measurement result of a substrate stage 105) output from a measurement device 134, and controls a pulsed light source 101 to emit light in synchronism with the sampling timing. Thus, the sampling timing of the position measurement result and the light emission timing of the pulsed light source 101 are synchronized with each other. This obviates the need to correct the position measurement result, unlike the first embodiment.

The exposure apparatus EX according to the second embodiment includes an original stage 103 including first marks 123, and the substrate stage 105 including second marks 133 and a photoelectric conversion device 135 which detects light having passed through the second marks 133. The exposure apparatus EX also includes a projection optical system 104 which projects the pattern of an original 121 held by the original stage 103 onto a substrate 131 held by the substrate stage 105, a measurement device 124, the measurement device 134, and the controller 106.

The controller 106 serves as a digital signal processor, and cyclically samples the position measurement result of the original stage 103, which is output from the measurement device 124, and that of the substrate stage 105, which is output from the measurement device 134. The controller 106 moves the substrate stage 105 or the original stage 103 while causing light supplied from the pulsed light source 101 to enter the photoelectric conversion device 135 via the first marks 123, projection optical system 104, and second marks 133. The controller 106 detects the positional relationship between the first marks 123 and the second marks 133 based on a signal (a signal indicating the light amount) output from the photoelectric conversion device 135 and position measurement results output from the measurement devices 134 and 124 at that time. Note that in moving the substrate stage 105, the original stage 103 is positioned such that the first marks 123 coincide with the object plane of the projection optical system 104.

Third Embodiment

A method of manufacturing a device according to an embodiment of the present invention is suitable for manufacturing devices such as a semiconductor device and a liquid crystal device. The method can include a step of exposing a substrate coated with a photosensitive agent using the above-mentioned exposure apparatus, and a step of developing the exposed substrate. The method of manufacturing a device can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-278943, filed Dec. 8, 2009, which is hereby incorporated by reference herein in its entirety.

What is claimed is:

1. An exposure apparatus comprising:
   an original stage including a first mark;
   a substrate stage including a second mark and a photoelectric conversion device configured to detect light having passed through the second mark;
   a projection optical system configured to project a pattern of an original held by the original stage onto a substrate held by the substrate stage;
   a measurement device configured to measure a position of one of the substrate stage and the original stage; and
   a controller configured to detect a positional relationship between the first mark and the second mark based on a signal output from the photoelectric conversion device and a measurement result output from the measurement device upon moving the one of the substrate stage and the original stage while causing light supplied from a pulsed light source to enter the photoelectric conversion device via the first mark, the projection optical system, and the second mark,
   wherein the controller samples, at a plurality of sampling timings in accordance with predetermined cycle, a measurement result output from the measurement device, corrects the sampled measurement results at the plurality of sampling timings based on time intervals between a plurality of light emission timings of the pulsed light source and the plurality of sampling timings to determine positions of the one of the substrate stage and the original stage at the plurality of light emission timings, and detects the positional relationship between the first mark and the second mark based on the determined positions.

2. The apparatus according to claim 1, wherein the controller includes a counter configured to start counting in accordance with the light emission timing of the pulsed light source and end the counting in accordance with the sampling timing, obtains the time interval based on a count value obtained by the counter, and corrects the measurement result based on the obtained time interval and a velocity of the one of the substrate stage and the original stage.

3. The apparatus according to claim 1, wherein the controller includes a counter configured to start counting in accordance with the sampling timing and end the counting in accordance with the light emission timing of the pulsed light source, obtains the time interval based on a count value obtained by the counter, and corrects the measurement result based on the obtained time interval and a velocity of the one of the substrate stage and the original stage.

4. The apparatus according to claim 1, wherein the controller detects a positional relationship between the first mark and the second mark in a direction parallel to an optical axis of the projection optical system.

5. The apparatus according to claim 1, wherein the controller detects a positional relationship between the first mark and the second mark in a direction perpendicular to an optical axis of the projection optical system.

6. The apparatus according to claim 1, wherein the pattern of the original is projected onto the substrate by the projection optical system using light from the pulsed light source.

7. A method of manufacturing a device, the method comprising the steps of:
   exposing a substrate using an exposure apparatus; and
   developing the substrate exposed in the exposing step,
   wherein the exposure apparatus comprises:
   an original stage including a first mark;
   a substrate stage including a second mark and a photoelectric conversion device configured to detect light having passed through the second mark;
   a projection optical system configured to project a pattern of an original held by the original stage onto the substrate held by the substrate stage;
   a measurement device configured to measure a position of one of the substrate stage and the original stage; and
   a controller configured to detect a positional relationship between the first mark and the second mark based on a signal output from the photoelectric conversion device and a measurement result output from the measurement device upon moving the one of the substrate stage and the original stage while causing light supplied from a pulsed light source to enter the photoelectric conversion device via the first mark, the projection optical system, and the second mark,
   wherein the controller samples, at a plurality of sampling timings in accordance with predetermined cycle, a measurement result output from the measurement device, corrects the sampled measurement results at the plurality of sampling timings based on time intervals between a plurality of light emission timings of the pulsed light source and the plurality of sampling timings to determine positions of the one of the substrate stage and the original stage at plurality of light emission timings, and detects the positional relationship between the first mark and the second mark based on the determined positions.

8. An exposure apparatus comprising:
   a photoelectric conversion device configured to detect light having passed through an original-side mark and a substrate-side mark;
   a projection optical system configured to project a pattern of an original held by an original stage onto a substrate held by a substrate stage;
   a measurement device configured to measure a position of one of the substrate stage and the original stage; and
   a controller configured to detect a positional relationship between the original-side mark and the substrate-side mark based on a signal output from the photoelectric conversion device and a measurement result output from the measurement device upon moving the one of the substrate stage and the original stage while causing light supplied from a pulsed light source to enter the photoelectric conversion device via the original-side mark, the projection optical system, and the substrate-side mark,
   wherein the controller samples, at a plurality of sampling timings in accordance with predetermined cycle, a measurement result output from the measurement device, corrects the sampled measurement results at the plurality of sampling timings based on time intervals between a plurality of light emission timings of the pulsed light source and the plurality of sampling timings to determine positions of the one of the substrate stage and the original stage at the plurality of light emission timings, and detects the positional relationship between the original-side mark and the substrate-side mark based on the determined positions.

9. A method of manufacturing a device, the method comprising the steps of:
exposing a substrate using an exposure apparatus; and
developing the substrate exposed in the exposing step,
wherein the exposure apparatus comprises:
a photoelectric conversion device configured to detect light having passed through an original-side mark and a substrate-side mark;
a projection optical system configured to project a pattern of an original held by an original stage onto the substrate held by a substrate stage;
a measurement device configured to measure a position of one of the substrate stage and the original stage; and
a controller configured to detect a positional relationship between the original-side mark and the substrate-side mark based on a signal output from the photoelectric conversion device and a measurement result output from the measurement device upon moving the one of the substrate stage and the original stage while causing light supplied from a pulsed light source to enter the photoelectric conversion device via the original-side mark, the projection optical system, and the substrate-side mark,
wherein the controller samples, at a plurality of sampling timings in accordance with predetermined cycle, a measurement result output from the measurement device, corrects the sampled measurement results at the plurality of sampling timings based on time intervals between a plurality of light emission timings of the pulsed light source and the plurality of sampling timings to determine positions of the one of the substrate stage and the original stage at the plurality of light emission timings, and detects the positional relationship between the original-side mark and the substrate-side mark based on the determined positions.

* * * * *